United States Patent
Dadashev

(10) Patent No.: US 7,142,464 B2
(45) Date of Patent: Nov. 28, 2006

(54) APPARATUS AND METHODS FOR MULTI-LEVEL SENSING IN A MEMORY ARRAY

(75) Inventor: Oleg Dadashev, Hadera (IL)

(73) Assignee: Saifun Semiconductors Ltd., Netanya (IL)

( * ) Notice: Subject to any disclaimer, the term of this patent is extended or adjusted under 35 U.S.C. 154(b) by 189 days.

(21) Appl. No.: 10/810,683

(22) Filed: Mar. 29, 2004

(65) Prior Publication Data

US 2004/0218426 A1    Nov. 4, 2004

Related U.S. Application Data

(60) Provisional application No. 60/466,063, filed on Apr. 29, 2003.

(51) Int. Cl.
G11C 5/14 (2006.01)
G11C 7/00 (2006.01)
(52) U.S. Cl. .................. 365/189.09; 365/194
(58) Field of Classification Search .......... 365/189.09, 365/194, 207, 189.07
See application file for complete search history.

(56) References Cited

U.S. PATENT DOCUMENTS

| | | |
|---|---|---|
| 4,342,102 A | 7/1982 | Puar |
| 4,388,705 A | 6/1983 | Sheppard |
| 4,389,705 A | 6/1983 | Sheppard |
| 4,527,257 A | 7/1985 | Cricchi |
| 4,667,217 A | 5/1987 | Janning |
| 5,027,321 A | 6/1991 | Park |
| 5,142,496 A | 8/1992 | Van Buskirk |
| 5,172,338 A | 12/1992 | Mehrotra et al. |
| 5,241,497 A | 8/1993 | Komarek |
| 5,276,646 A | 1/1994 | Kim et al. |
| 5,289,412 A | 2/1994 | Frary et al. |
| 5,295,108 A | 3/1994 | Higa |
| 5,305,262 A | 4/1994 | Yoneda |
| 5,335,198 A | 8/1994 | Van Buskirk et al. |
| 5,345,425 A | 9/1994 | Shikatani |
| 5,349,221 A | 9/1994 | Shimoji |
| 5,359,554 A | 10/1994 | Odake et al. |
| 5,361,343 A | 11/1994 | Kosonocky et al. |
| 5,381,374 A | 1/1995 | Shiraishi et al. |
| 5,418,743 A | 5/1995 | Tomioka et al. |
| 5,434,825 A | 7/1995 | Harari |
| 5,450,341 A | 9/1995 | Sawada et al. |
| 5,450,354 A | 9/1995 | Sawada et al. |
| 5,477,499 A | 12/1995 | Van Buskirk et al. |
| 5,508,968 A | 4/1996 | Collins et al. |
| 5,521,870 A | 5/1996 | Ishikawa |
| 5,537,358 A | 7/1996 | Fong |
| 5,544,116 A | 8/1996 | Chao et al. |
| 5,568,085 A | 10/1996 | Eitan et al. |

(Continued)

FOREIGN PATENT DOCUMENTS

EP    0740307    10/1996

(Continued)

*Primary Examiner*—Anh Phung
(74) *Attorney, Agent, or Firm*—Eitan Law Group

(57) ABSTRACT

A method for sensing a signal received from an array cell within a memory array, the method comprising the steps of generating an analog voltage Vddr proportional to a current of a selected array cell of the memory array, and comparing the analog voltage Vddr with a reference analog voltage Vcomp to generate an output digital signal. A method is also provided for sensing a memory cell by transforming a signal from a memory cell to a time delay, and sensing the memory cell by comparing the time delay to a time delay of a reference cell. Related apparatus is also disclosed.

17 Claims, 10 Drawing Sheets

U.S. PATENT DOCUMENTS

| | | | |
|---|---|---|---|
| 5,583,808 A | 12/1996 | Brahmbhatt | |
| 5,627,790 A | 5/1997 | Golla et al. | |
| 5,633,603 A | 5/1997 | Lee | |
| 5,657,332 A | 8/1997 | Auclair et al. | |
| 5,694,356 A | 12/1997 | Wong et al. | |
| 5,712,815 A | 1/1998 | Bill et al. | |
| 5,717,632 A | 2/1998 | Richart et al. | |
| 5,748,534 A | 5/1998 | Dunlap et al. | |
| 5,754,475 A | 5/1998 | Bill et al. | |
| 5,768,193 A | 6/1998 | Lee et al. | |
| 5,771,197 A | 6/1998 | Kim | |
| 5,784,314 A | 7/1998 | Sali et al. | |
| 5,805,500 A | 9/1998 | Campardo et al. | |
| 5,812,449 A | 9/1998 | Song | |
| 5,812,456 A | 9/1998 | Hull et al. | |
| 5,822,256 A | 10/1998 | Bauer et al. | |
| 5,828,601 A | 10/1998 | Hollmer et al. | |
| 5,841,700 A | 11/1998 | Chang | |
| 5,847,441 A | 12/1998 | Cutter et al. | |
| 5,867,429 A | 2/1999 | Chen et al. | |
| 5,886,927 A | 3/1999 | Takeuchi | |
| 5,936,888 A | 8/1999 | Sugawara | |
| 5,940,332 A | 8/1999 | Artieri | |
| 5,946,258 A | 8/1999 | Evertt et al. | |
| 5,949,728 A | 9/1999 | Liu et al. | |
| 5,969,993 A | 10/1999 | Takeshima | |
| 5,982,666 A | 11/1999 | Campardo | |
| 5,986,940 A | 11/1999 | Atsumi et al. | |
| 6,011,725 A | 1/2000 | Eitan | |
| 6,034,896 A | 3/2000 | Ranaweera et al. | |
| 6,044,019 A | 3/2000 | Cernea et al. | |
| 6,044,022 A | 3/2000 | Nachumovsky | |
| 6,084,794 A | 7/2000 | Lu et al. | |
| 6,108,240 A | 8/2000 | Lavi et al. | |
| 6,118,692 A | 9/2000 | Banks | |
| 6,128,226 A | 10/2000 | Eitan et al. | |
| 6,128,227 A * | 10/2000 | Kim | 365/185.21 |
| 6,134,156 A | 10/2000 | Eitan | |
| 6,147,904 A | 11/2000 | Liron | |
| 6,163,484 A * | 12/2000 | Uekubo | 365/185.2 |
| 6,169,691 B1 | 1/2001 | Pasotti et al. | |
| 6,185,143 B1 | 2/2001 | Perner et al. | |
| 6,201,737 B1 | 3/2001 | Hollmer et al. | |
| 6,205,056 B1 | 3/2001 | Pan et al. | |
| 6,219,290 B1 * | 4/2001 | Chang et al. | 365/207 |
| 6,222,762 B1 | 4/2001 | Guterman et al. | |
| 6,233,180 B1 | 5/2001 | Eitan et al. | |
| 6,240,040 B1 | 5/2001 | Akaogi et al. | |
| 6,252,799 B1 | 6/2001 | Liu et al. | |
| 6,282,133 B1 | 8/2001 | Nakagawa et al. | |
| 6,285,589 B1 | 9/2001 | Kajitani | |
| 6,307,807 B1 | 10/2001 | Sakui et al. | |
| 6,331,950 B1 | 12/2001 | Kuo et al. | |
| 6,351,415 B1 | 2/2002 | Kushnarenko | |
| 6,353,554 B1 | 3/2002 | Banks | |
| 6,400,607 B1 * | 6/2002 | Pasotti et al. | 365/185.21 |
| 6,469,929 B1 | 10/2002 | Kushnarenko et al. | |
| 6,469,935 B1 | 10/2002 | Hayashi | |
| 6,496,414 B1 | 12/2002 | Kasa et al. | |
| 6,510,082 B1 | 1/2003 | Le et al. | |
| 6,522,585 B1 | 2/2003 | Pasternak | |
| 6,525,969 B1 | 2/2003 | Kurihara et al. | |
| 6,529,412 B1 | 3/2003 | Chen et al. | |
| 6,535,434 B1 | 3/2003 | Maayan et al. | |
| 6,552,387 B1 | 4/2003 | Eitan | |
| 6,574,139 B1 | 6/2003 | Kurihara | |
| 6,594,181 B1 | 7/2003 | Yamada | |
| 6,636,440 B1 | 10/2003 | Maayan et al. | |
| 6,639,837 B1 | 10/2003 | Takano et al. | |
| 6,639,844 B1 | 10/2003 | Liu et al. | |
| 6,643,170 B1 | 11/2003 | Huang et al. | |
| 6,643,178 B1 | 11/2003 | Kurihara | |
| 6,650,568 B1 | 11/2003 | Iijima | |
| 6,670,669 B1 | 12/2003 | Kawamura | |
| 6,990,001 B1 * | 1/2006 | Ma et al. | 365/49 |
| 2001/0006477 A1 | 7/2001 | Banks | |
| 2002/0004878 A1 | 1/2002 | Norman | |
| 2002/0034097 A1 | 3/2002 | Banks | |
| 2002/0071313 A1 | 6/2002 | Takano et al. | |
| 2002/0132436 A1 | 9/2002 | Eliyahu et al. | |
| 2002/0191465 A1 | 12/2002 | Maayan et al. | |
| 2003/0117841 A1 | 6/2003 | Yamashita | |
| 2003/0117861 A1 | 6/2003 | Maayan et al. | |
| 2003/0142544 A1 | 7/2003 | Maayan et al. | |
| 2003/0208663 A1 | 11/2003 | Van Buskirk et al. | |
| 2003/0214844 A1 | 11/2003 | Iijima | |
| 2004/0008541 A1 | 1/2004 | Maayan et al. | |
| 2004/0012993 A1 | 1/2004 | Kurihara | |
| 2004/0013000 A1 | 1/2004 | Torii | |

FOREIGN PATENT DOCUMENTS

| | | |
|---|---|---|
| EP | 1 071 096 | 1/2001 |
| EP | 1126468 | 8/2001 |
| EP | 1164597 | 12/2001 |
| EP | 0 656 628 | 4/2003 |
| JP | 408106791 | 4/1996 |
| JP | 02002216488 | 8/2002 |
| WO | WO 00/46808 | 8/2000 |
| WO | WO 03/036651 | 5/2003 |
| WO | WO 03/063168 | 7/2003 |
| WO | WO 03/088261 | 10/2003 |

* cited by examiner

APPARATUS AND METHODS FOR MULTI-LEVEL SENSING IN A MEMORY ARRAY

CROSS-REFERENCE TO RELATED APPLICATIONS

This application claims priority from U.S. provisional patent application Ser. No. 60/466,063, filed Apr. 29, 2003, which is hereby incorporated by reference in its entirety.

FIELD OF THE INVENTION

The present invention relates generally to semiconductor memories, and more particularly to devices for multi-level sensing of signals received from a memory cell.

BACKGROUND OF THE INVENTION

Memory devices, such as random access memory (RAM), read-only memory (ROM), non-volatile memory (NVM) and the like, are well known in the art. A memory device includes an array of memory cells and peripheral supporting systems for managing, programming/erasing and data retrieval operations.

These devices provide an indication of the data, which is stored, therein by providing an output electrical signal. A device called a sense amplifier (SA) is used for detecting the signal and determining the logical content thereof.

In general, sense amplifiers determine the logical value stored in a cell by comparing the output of the cell (voltage or current) with a threshold level (voltage or current). If the output is above the threshold, the cell is determined to be erased (with a logical value of 1) and if the output is below the threshold, the cell is determined to be programmed (with a logical value of 0).

The threshold level is typically set as a level between the expected erased and programmed levels, which is high enough (or sufficiently far from both expected levels) so that noise on the output will not cause false results.

An example of a prior art sense amplifier circuit is shown in FIG. 1. This sense amplifier circuit is similar to a sense amplifier described in U.S. Pat. No. 6,469,929 to Alexander Kushnarenko and Oleg Dadashev, entitled "Structure and method for high speed sensing of memory array".

FIG. 1 illustrates a prior art sensing system for a memory array 110, which includes a plurality of memory cells arranged in any number of rows and columns. For purposes of illustration, assume that a memory cell 111 is to be read (i.e. sensed). Memory cell 111 has its drain and source terminals coupled to array bit lines BN and BN+1 and its control terminal coupled to a word line W1. Memory cell 111 is selectively coupled to a system bit line BL using a column decoder 104 (for selecting the array bit lines) and a row decoder 103 (for selecting the word lines). The system bit line BL may include an associated parasitic capacitance CBL that is proportional to the number of memory cells coupled to the selected array bit line.

Similarly for a memory array 112, a memory cell 113 has its drain and source terminals coupled to array bit lines BM and BM+1 and its control terminal coupled to a word line W1. Memory cell 113 is selectively coupled to a system bit line BL_REF using a column decoder 105 (for selecting the array bit lines) and a row decoder 106 (for selecting the word lines). The system bit line BL may include an associated parasitic capacitance CREF_BL that is proportional to the number of memory cells coupled to the selected array bit line.

To read (i.e. sense) the state of memory cell 111 in memory array 110, the array bit line BN is coupled to the system bit line BL, the array bit line BN+1 is coupled to a predetermined voltage (e.g. ground), and the word line W1 is coupled to a read voltage (e.g., 3 volts). The operation of decoders 103 and 104 to provide the above-described coupling is well known and therefore not described in detail herein.

The previous paragraph and the following description hold true, mutatis mutandis, for memory cell 113 in memory array 112, that is, the circuitry on the right side of FIG. 1.

To ensure that a sense amplifier 145 correctly senses the logic state of memory cell 111, the system bit line BL may be charged to a predetermined level (e.g., approximately 2V) before the sensing of memory cell 111. The optimal charging of the system bit line BL may facilitate a quick transition to the predetermined voltage without overshooting this predetermined voltage. This charging operation may be initiated using a charge initiation device P2 and advantageously controlled using a control unit 120 (control unit 121 for the right side of FIG. 1) that quickly and efficiently charges the system bit line BL.

Specifically, to initiate a charge operation, an active signal CHARGE turns on charge initiation device P2 (P7 for the right side of FIG. 1). Charge initiation device P2 may comprise a PMOS (p-channel metal oxide semiconductor) transistor, wherein the active signal CHARGE is a logic 0. When conducting, charge initiation device P2 transfers a pull-up signal provided by the sense amplifier 145 (explained in detail below) to control unit 120.

Control unit 120 may comprise a static clamp including an NMOS (n-channel metal oxide semiconductor) transistor N1 (N2 for the right side of FIG. 1) and a dynamic clamp including a PMOS transistor P1 (P8 for the right side of FIG. 1). The transistor N1 may have its drain connected to charge initiation device P2 and its source connected to system bit line BL. Transistor N1 receives a bias voltage VB on its gate. Bias voltage VB is the gate bias voltage for transistor N1 as defined by:

$$VTN < VB < VBLD + VTN$$

wherein VBLD is the desired voltage on bit line BL and VTN is the threshold voltage of the n-type transistor (e.g., 0.6V). In this manner, transistor N1 charges bit line BL very quickly to VB-VTN. At this point, transistor N1 transitions to non-conducting, i.e. the static clamp deactivates, and the dynamic clamp is activated (as explained below).

The dynamic clamp of control unit 120 may include PMOS transistor P1 having its source connected to charge initiation device P2 (also the drain of transistor N1) and its drain coupled to bit line BL (also the source of transistor N1). The dynamic clamp further comprises a comparator C1 (C2 for the right side of FIG. 1), which compares a reference voltage BIAS and the bit line voltage BL and then outputs a signal VG representative of that comparison. Specifically, comparator C1 outputs a low signal VG if VBL is less than BIAS and outputs a high signal VG if VBL is greater than BIAS (or if comparator C1 is disabled). The reference voltage BIAS may be approximately equal to the desired bit line voltage VBLD on the system bit line BL. The transistor P1 receives the signal VG on its control gate.

Sense amplifier 145 may include first stages 130 and 131 and second stage 140. The first stage 130 includes a pull-up device N4, which is an NMOS transistor having its drain and gate connected to a supply voltage VDD and its source connected to charge initiation device P2, and a current sensing device P3, which is a PMOS transistor having its drain and gate connected to charge initiation device P2 and its source connected to the supply voltage VDD. Note that in this configuration, current sensing device P3 advantageously functions as a diode, which is explained in further detail below.

The first stage 131 has an identical configuration to first stage 130. Specifically, first stage 131 includes a pull-up device N3, which is an NMOS transistor having its drain and gate connected to a supply voltage VDD and its source connected to charge initiation device P7, and a current sensing device P6, which is a PMOS transistor having its drain and gate connected to charge initiation device P7 and its source connected to the supply voltage VDD.

After charge initiation device P2 (P7 for the right side of FIG. 1) is activated, both pull-up transistor N4 (N3) and current sensing device P3 (P6) conduct strongly. During the charge operation, the system bit line BL initially receives a pull-up voltage of VDD-VTN via pull-up transistor N4 (N3). Then, via current sensing device P3 (P6), the voltage on the system bit line BL increases to VDD-VTP, wherein VTP is the threshold voltage of the PMOS transistor. Note that the voltage VDD-VTP is substantially equal to the desired system bit line voltage VBLD. At this point, this increased voltage on the system bit line BL turns off pull-up transistor N4 (N3). Because current sensing device P3 (P6) is connected as a diode, only current IBL ($IBL_{13}$ REF) is detected. Therefore, depending on the state of the sensed memory cell, a predetermined current can flow through current sensing device P3 (P6).

Current sensing devices P3 and P6 in first stages 130 and 131, respectively, have current mirrors provided in second stage 140. Specifically, the current IBL through current sensing device P3 is reflected in the current I1 through a PMOS transistor P4, whereas the current $IBL_{13}$ REF through current sensing device P6 is reflected in the current I2 through a PMOS transistor P5. The ratio of the currents through current sensing device P3 and PMOS transistor P4 defines the gain of first stage 130, whereas the ratio of the current through current sensing device P6 and PMOS transistor P6 defines the gain of first stage 131. A latch circuit 141 (e.g., amplifier block) may amplify and compare currents I1 and I2.

The sense amplifier 145 may not operate properly unless the VDD supply voltage is greater than a minimum voltage VDD_MIN, which is defined as follows:

$$V_{DD\_MIN} = V_{DIODE\_MAX} + V_{BL\_MIN} + V_{P1/P8} + V_{P2/P7} \quad (1)$$

In equation (1), VDIODE_MAX is the maximum voltage drop across PMOS transistor P3 or PMOS transistor P6, VBL_MIN is the minimum acceptable bit line voltage for the non-volatile memory technology, VP1/P8 is the drain-to-source voltage drop of PMOS transistor P1 (or PMOS transistor P8), and VP2/P7 equal to the drain-to-source voltage drop on PMOS transistor P2 (or PMOS transistor P7).

For example, if VDIODE_MAX is equal to 1.0 Volt, VBL_MIN is equal to 1.8 Volts, and VP1/P8 and VP2/P7 are equal to 0.05 Volts, then the minimum supply voltage VDD_MIN is equal to 2.9 Volts (1.8V+1V+0.05V+0.05V). In such a case, memory device 100 would not be usable in applications that use a VDD supply voltage lower than 2.9 Volts.

In addition, sense amplifier first stages 130 and 131 are sensitive to noise in the VDD supply voltage. If, during a read operation, the VDD supply voltage rises to an increased voltage of VDD_OVERSHOOT, then the voltages VSA1 and VSA2 on the drains of PMOS transistors P3 and P6 rise to a level approximately equal to VDD_OVERSHOOT minus a diode voltage drop. If the VDD supply voltage then falls to a reduced voltage of VDD_UNDERSHOOT, then transistors P3 and P6 may be turned off. At this time, sense amplifier first stages 130 and 131 cannot operate until the cell currents IBL and IBL_REF discharge the voltages VSA1 and VSA2. If the cell current IBL is low, then sense amplifier first stage 130 will remain turned off until the end of the read operation, thereby causing the read operation to fail.

Accordingly, it is desirable to provide a sensing system that can accommodate low supply voltages and tolerate supply voltage fluctuations.

SUMMARY OF THE INVENTION

The present invention seeks to provide apparatus and methods for multi-level sensing in a memory array, as is described more in detail hereinbelow.

The present invention enables multi-level sensing at a lower voltage operation. The multi-level sensing may not be sensitive to Vdd noise (over/under shoots).

There is thus provided in accordance with an embodiment of the invention a method for sensing a signal received from an array cell within a memory array, the method including the steps of generating an analog voltage Vddr proportional to a current of a selected array cell of the memory array, and comparing the analog voltage Vddr with a reference analog voltage Vcomp to generate an output digital signal.

In accordance with an embodiment of the invention the method further includes providing a reference unit with a reference cell having a similar structure and a similar current path therethrough to that of the array cell, and providing a drain driver for driving drain bit lines of the memory array and reference drain bit lines of the reference unit, wherein the drain driver generates the analog voltage Vddr.

Further in accordance with an embodiment of the invention if the analog voltage Vddr is greater than the reference analog voltage Vcomp then a low output digital signal is output, and if the analog voltage Vddr is not greater than the reference analog voltage Vcomp then a high output digital signal is output.

In accordance with an embodiment of the invention the method further includes discharging the memory array and the reference unit, charging the memory array and the reference unit so as to generate an array cell signal and a reference signal, respectively, and a timing signal, generating a read signal when the timing signal reaches a predefined voltage level, and generating a sensing signal from the difference of the cell and reference signals once the read signal is generated.

There is also provided in accordance with an embodiment of the invention a method for sensing a memory cell, the method including the steps of transforming a signal from a memory cell to a time delay, and sensing the memory cell by comparing the time delay to a time delay of a reference cell. The time delay may include a digital signal delay. At least one of rise and fall times of the time delays may be compared. Transforming the signal from the memory cell to the time delay may include generating an analog voltage Vddr proportional to a current of the memory cell. The analog voltage Vddr may be compared with a reference analog voltage Vcomp to generate an output digital signal.

There is also provided in accordance with an embodiment of the invention apparatus for sensing a signal received from an array cell within a memory array, the apparatus including a drain driver adapted to generate an analog voltage Vddr proportional to a current of a selected array cell of the memory array, and a comparator adapted to compare the analog voltage Vddr with a reference analog voltage Vcomp to generate an output digital signal.

In accordance with an embodiment of the invention a reference unit may be provided with a reference cell having a similar structure and a similar current path therethrough to that of the array cell, wherein the drain driver is adapted to drive drain bit lines of the memory array and reference drain bit lines of the reference unit. A data unit may receive the output digital signal.

Further in accordance with an embodiment of the invention the comparator compares the analog voltage Vddr with a reference analog voltage Vcomp and generates the output digital signal in the following manner: if the analog voltage Vddr is greater than the reference analog voltage Vcomp then a low output digital signal is output, and if the analog voltage Vddr is not greater than the reference analog voltage Vcomp then a high output digital signal is output.

There is also provided in accordance with an embodiment of the invention apparatus for sensing a memory cell including a driver adapted to transform a signal from a memory cell to a time delay, and a comparator adapted to compare the time delay to a time delay of a reference cell.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
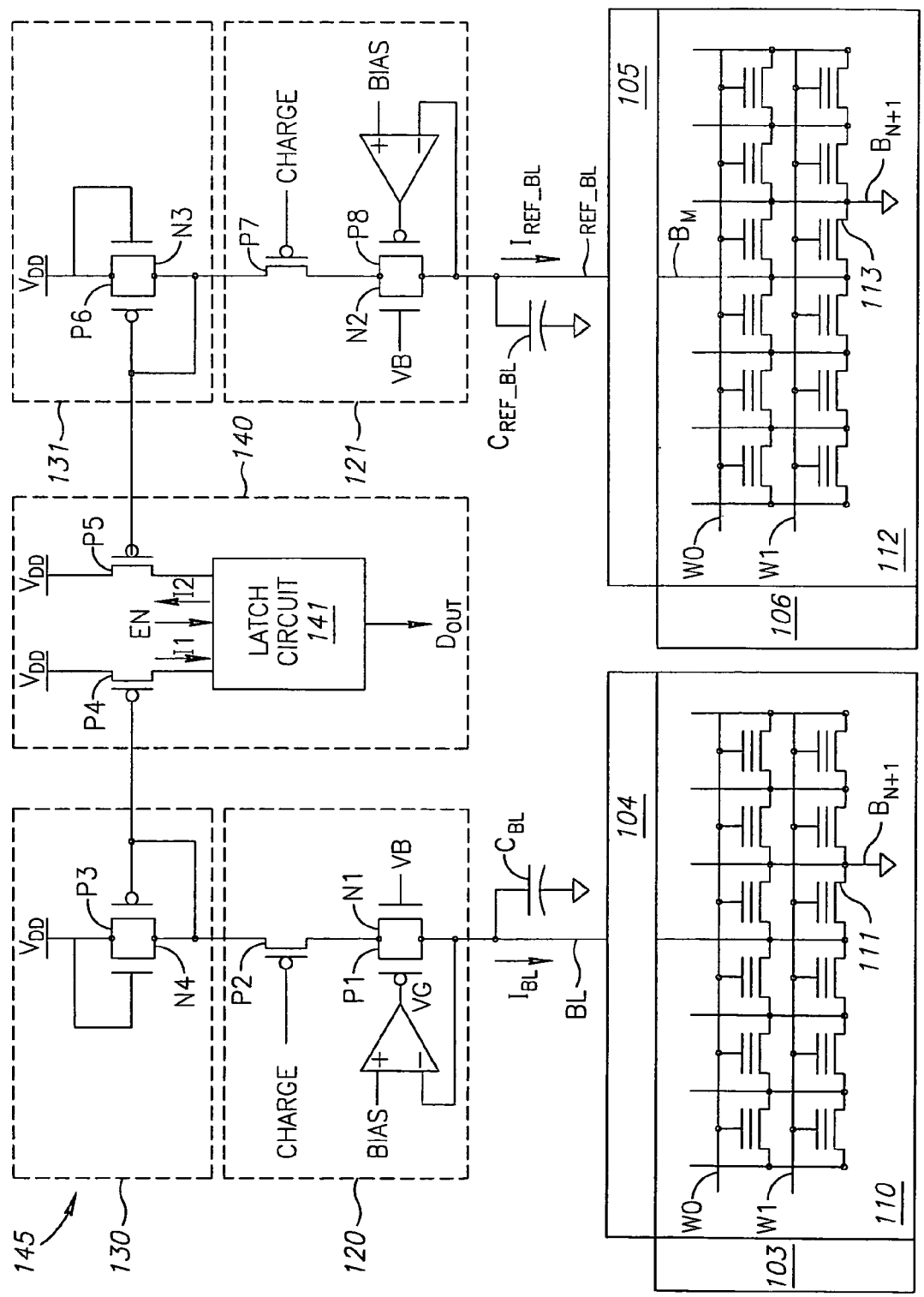
FIG. 1 is a simplified illustration of a prior art sensing system for a memory array, which includes a plurality of memory cells arranged in any number of rows and columns.
Figure 2:
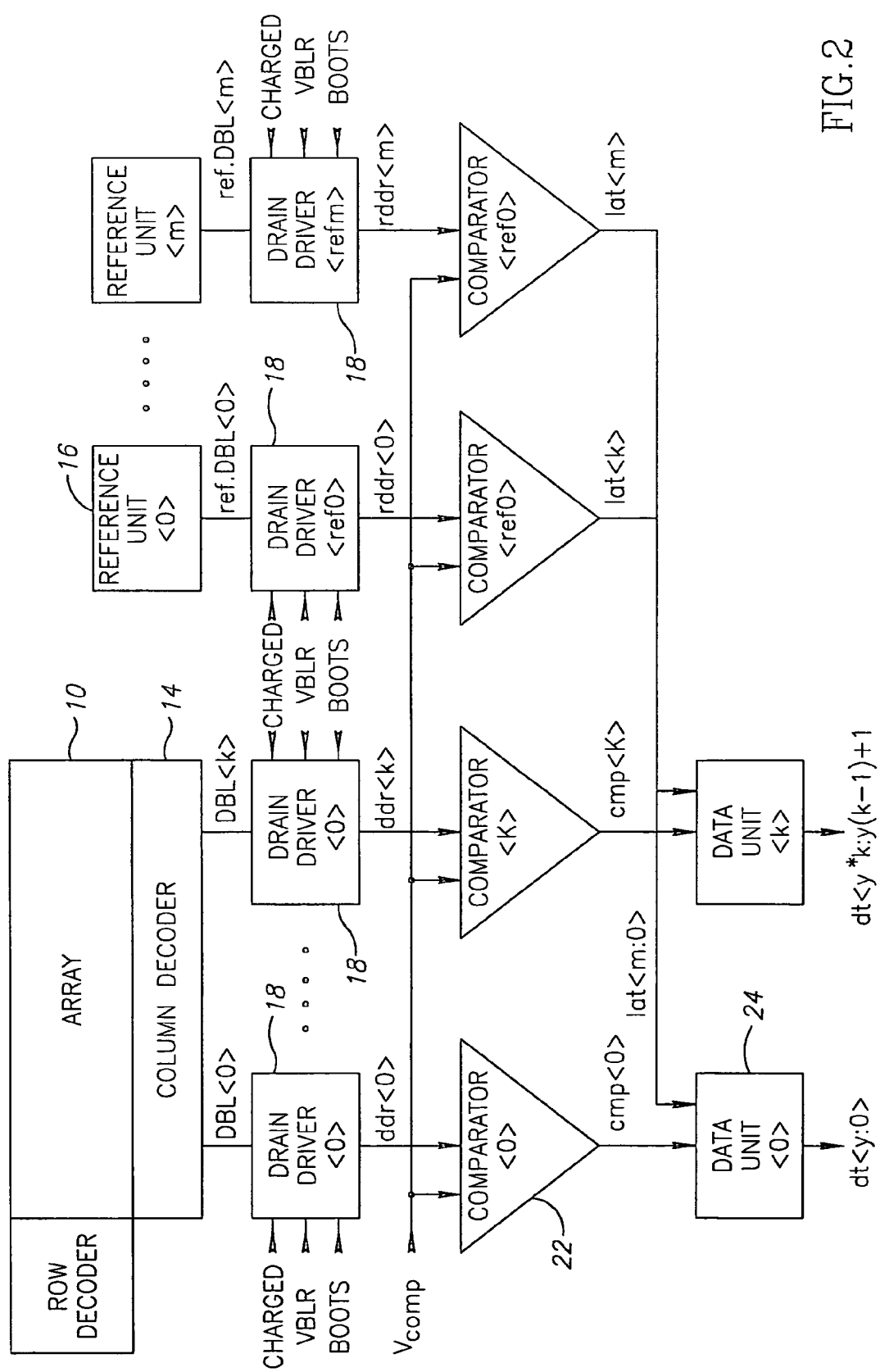
FIG. 2 is a simplified block diagram of a memory sensing system, constructed and operative in accordance with an embodiment of the present invention.
Figure 3:
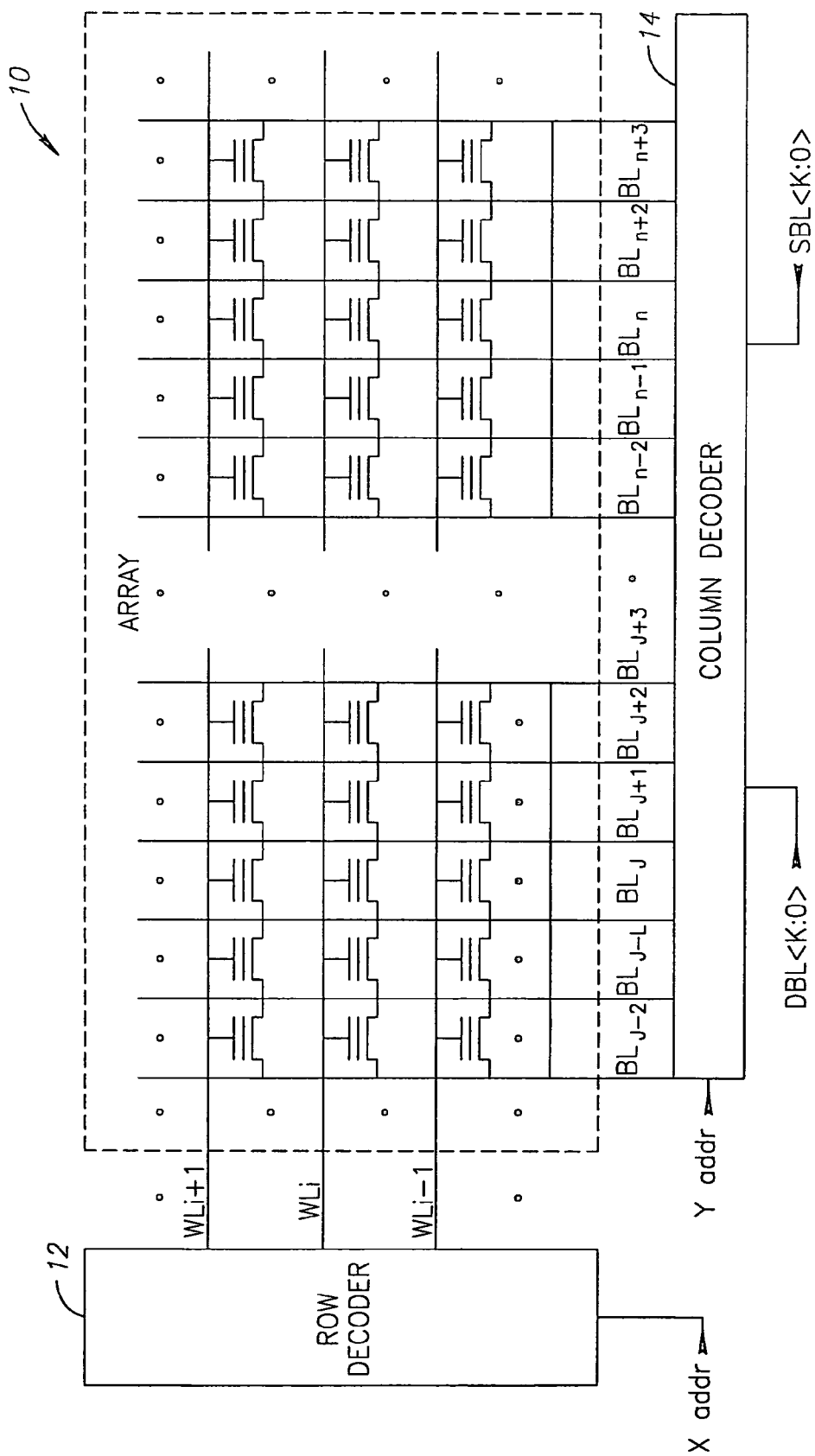
FIG. 3 is a simplified block diagram of a memory cell array, which may be read by the memory sensing system, in accordance with an embodiment of the present invention.

Reference is now made to FIG. 2, which illustrates a memory sensing system, constructed and operative in accordance with an embodiment of the present invention. Reference is also made to FIG. 3, which illustrates a memory cell array 10, which may be read by the memory sensing system, in accordance with an embodiment of the present invention.

Memory cells of array 10 are arranged in row and columns, and each memory cell is accessed during read, program, or erase operations by applying appropriate voltages associated word and bit lines. For example, as indicated in FIG. 3, the gate terminal of memory cell MCji is preferably connected to an associated word line (WL) WLi, and the drain and source terminals are preferably connected to associated bit lines (BLs) BLj and BLj+1.

Memory cells of array 10 may be addressed using a word line control circuit, i.e., row decoder 12, and a bit line control circuit, i.e., column decoder 14, according to input addresses signals Xaddr<h:0> and Yaddr<p:0>, respectively. Row decoder 12 provides an appropriated word line voltage to WL. Column decoder 14 connects selected drain bit lines (DBL) and source bit lines (SBL) of a memory cell to DBL and SBL inputs correspondingly.

As seen in FIGS. 2 and 3, a plurality of memory cells connected to the same selected word line may be accessed simultaneously. For example, k+1 memory cells may be accessed simultaneously. Accordingly, column decoder 14 may have k+1 DBL and SBL nodes: DBL<k:0>, SBL<k:0>. As seen in FIG. 3, in accordance with one embodiment of the sensing method, the nodes SBL<k:0> may be connected to ground (GND) during the read operation. The source voltage of the selected memory cells may be close to GND.

As seen in FIG. 2, the memory sensing system may comprise one or more reference units 16 with one or more reference memory cells (RMCs) having a structure and current path therethrough similar to that of the array cells. The reference unit may emulate the elements found in the current path from node DBL through MC to be read to node SBL. This may provide RC (resistance-capacitance) matching of the two paths.

Figure 4:
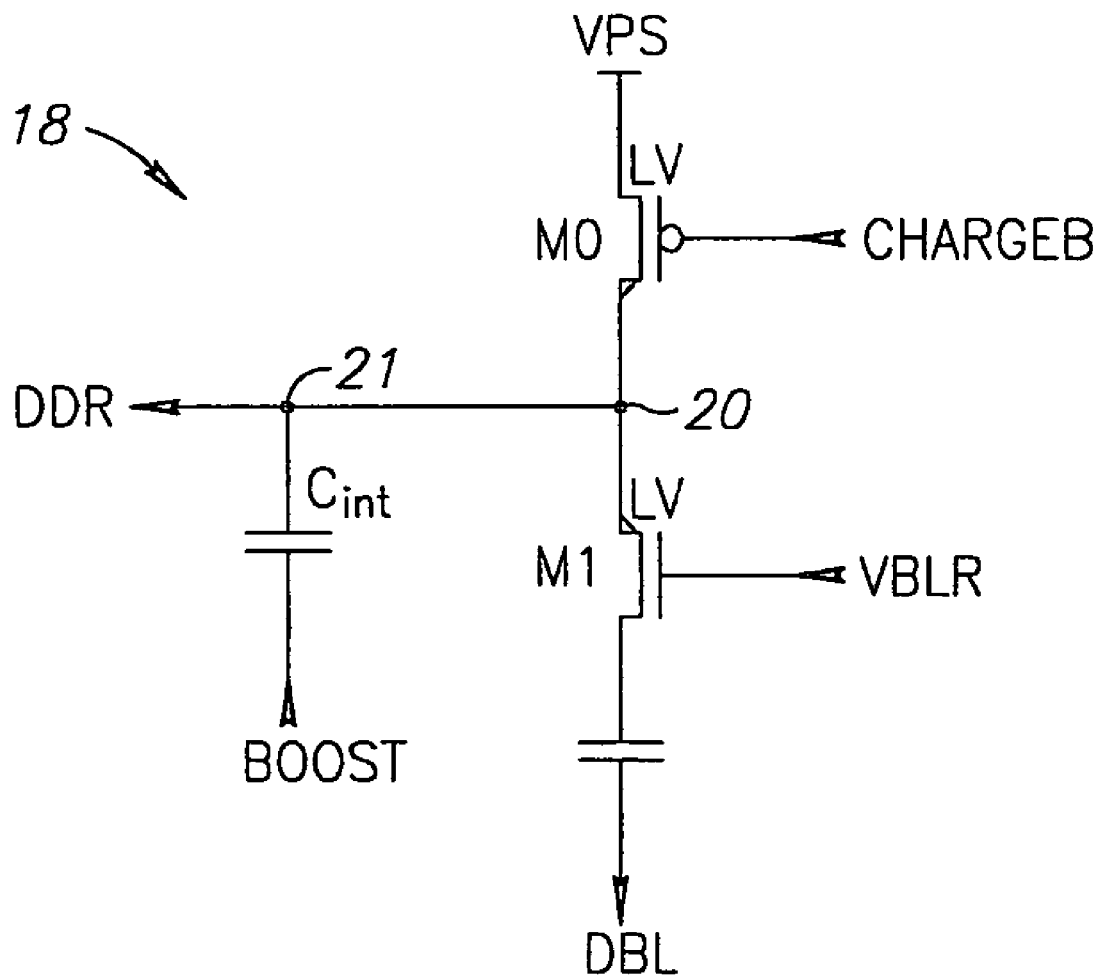
FIG. 4 is a simplified block diagram of a drain driver of the memory sensing system, constructed and operative in accordance with an embodiment of the present invention.

Drain drivers 18 may be provided for driving the drain bit lines of array 10 and the reference drain bit lines of reference units 16. Reference is now made to FIG. 4, which illustrates an example of a suitable drain driver 18, in accordance with an embodiment of the present invention. Drain driver 18 may comprise a PMOS (p-channel metal oxide semiconductor) pull-up transistor M0, wherein its gate terminal receives a logical signal input (chargeb), its source terminal receives a voltage input Vps and its drain terminal is connected to a node 20. An NMOS (n-channel metal oxide semiconductor) clamp transistor M1 may provided whose drain terminal is connected to the drain terminal of PMOS pull-up transistor M0 via node 20, whose gate terminal receives an input Vblr and whose source terminal is connected to the DBL input of the column decoder 14. An integrated capacitor Cint may be connected to a node 21, which is connected to a node 20 and a node ddr.

Drain driver 18 may execute two functions during a read operation:

a. provision of the required drain voltage of a memory cell during the read operation, and b. generation of a signal at node ddr (voltage Vddr) proportional to the current of a selected memory cell.

In order to provide the required drain voltage, the voltage Vps enters the drain of the NMOS clamp transistor M1 through the open PMOS pull-up transistor M0. The NMOS transistor M1, controlled by voltage Vblr at its gate, clamps its drain voltage Vps and transmits a reduced voltage Vd=Vblr−VgsM1 to the DBL input of the column decoder 14. The reduced voltage is transferred from the column decoder 14 to the drain terminal of the memory cell of the array 10.

The generation of the signal at node ddr is now explained with reference to FIG. 5, which illustrates waveforms of the drain driver signals, in accordance with an embodiment of the present invention. Before time T1, a logical signal chargeb is high and therefore PMOS pull-up transistor M0 is turned off (not conducting). At time T1, the signal chargeb goes down to 0V and turns on PMOS pull-up transistor M0 (i.e., it is now conducting). During the period of time right after time T1 and up to time T2, the signal ddr rises to Vps, and the drain bit line of the selected memory cell (both DBL nodes) becomes charged to voltage Vd. Current begins to flow through the memory cell. After the charging process to Vd is completed, the current of the path asymptotically stabilizes at the memory cell (MC) read current level, IMC.

Afterwards, at time T2, the signal chargeb returns to its high level Vps, thereby turning off PMOS transistor M0 again. Up until time T2, a signal boost may be optionally coupled to ground. Immediately after time T2, the signal boost may rise from 0V to Vboost. In response to the signal boost, the voltage of node ddr rises from its previous level Vps to voltage Vps+Vbst, where $$V_{bst}=V_{boost}*C_{\Sigma}/C_{int} \quad (2)$$

wherein $C_{\Sigma}$ is the total capacity of the node ddr;

Since the capacity Cint is significantly greater than other (parasitic) capacitors of the node ddr, $C\Sigma \approx C_{int}$ and $V_{bst} \approx V_{boost}$.

After time T2, the voltage Vddr decreases according to the equation $$V_{ddr\alpha}(t)=V_{ps}+V_{boost}-I_{\alpha}*t/C_{int}, \alpha=0,k \quad (3)$$

wherein $I_{\alpha}$ is the current through node $DBL_{\alpha}$, which equals $I_{MC}$.

As seen from equation (3), current IMCij is integrated on capacitor Cint. The voltage Vddr varies linearly with respect to the selected MC current IMCji and varies inversely with respect to the capacitance of capacitor Cint.

As long as Vddr is greater than Vd by some margin (e.g., on the order of about 0.2–0.3V) the NMOS transistor M1 works in saturation. The capacitance of the node ddr may be independent from the drain bit line capacitance, which may be a few orders of magnitude greater than Cint. The voltage of the nodes DBL and BL may remain at Vd during the time that Vddr(t) is developing, and therefore the drain-source voltage of the selected memory cell MCji remains constant as well.

As mentioned previously, the drain drivers 18 for driving the drain bit lines of array 10 (i.e., drain drivers <0:k> in FIG. 2) are preferably identical to the drain drivers for the reference units 16 (i.e., drain drivers <ref0:refm> in FIG. 2). Therefore, the signals rddr<m:0> are developed similarly to ddr(t):

$$V_{rddr\beta}(t)=V_{ps}+V_{boost}-I_{\beta}*t/C_{int}, \beta=0,m \quad (4)$$

wherein $I_{\beta}$ is the read current of α-th reference memory cell.

As seen in FIG. 2, the memory sensing system may comprise one or more comparators 22 for array 10 (i.e., comparators <0:k>) and for reference units 16 (i.e., comparators <ref0:refm>). Comparator 22 compares the analog voltage Vddr with a reference analog voltage Vcomp and generates an output digital signal cmp according to the follow rule shown in Table 1:

TABLE 1

| Input voltages relation | cmp |
|---|---|
| Vddr > Vcomp | low |
| Vddr < Vcomp | high |

A voltage of the signal Vcomp is disposed in an interval [Vd, Vps+Vbst]. Hence, in the time interval T1 to T2, all signals cmp<0:k> are low (logical level "0"). The signal cmp may be inverted to a high logical level at time:

$$T_{cs\alpha}=T2+(V_{ps}+V_{boost}-V_{comp})*C_{int}/I_{\alpha}, \alpha=0,k \quad (5)$$

A similar equation determines a time when output signals of the comparators <ref0÷refm> may be inverted:

$$T_{rcs\beta}=T2+(V_{ps}+V_{boost}-V_{comp})*C_{int}/I_{\beta}, \beta=0,m \quad (6)$$

As can be seen from equations (6) and (7), the values Tcsα and Trcsβ are an inverse function of the memory cell current.

Figure 6:
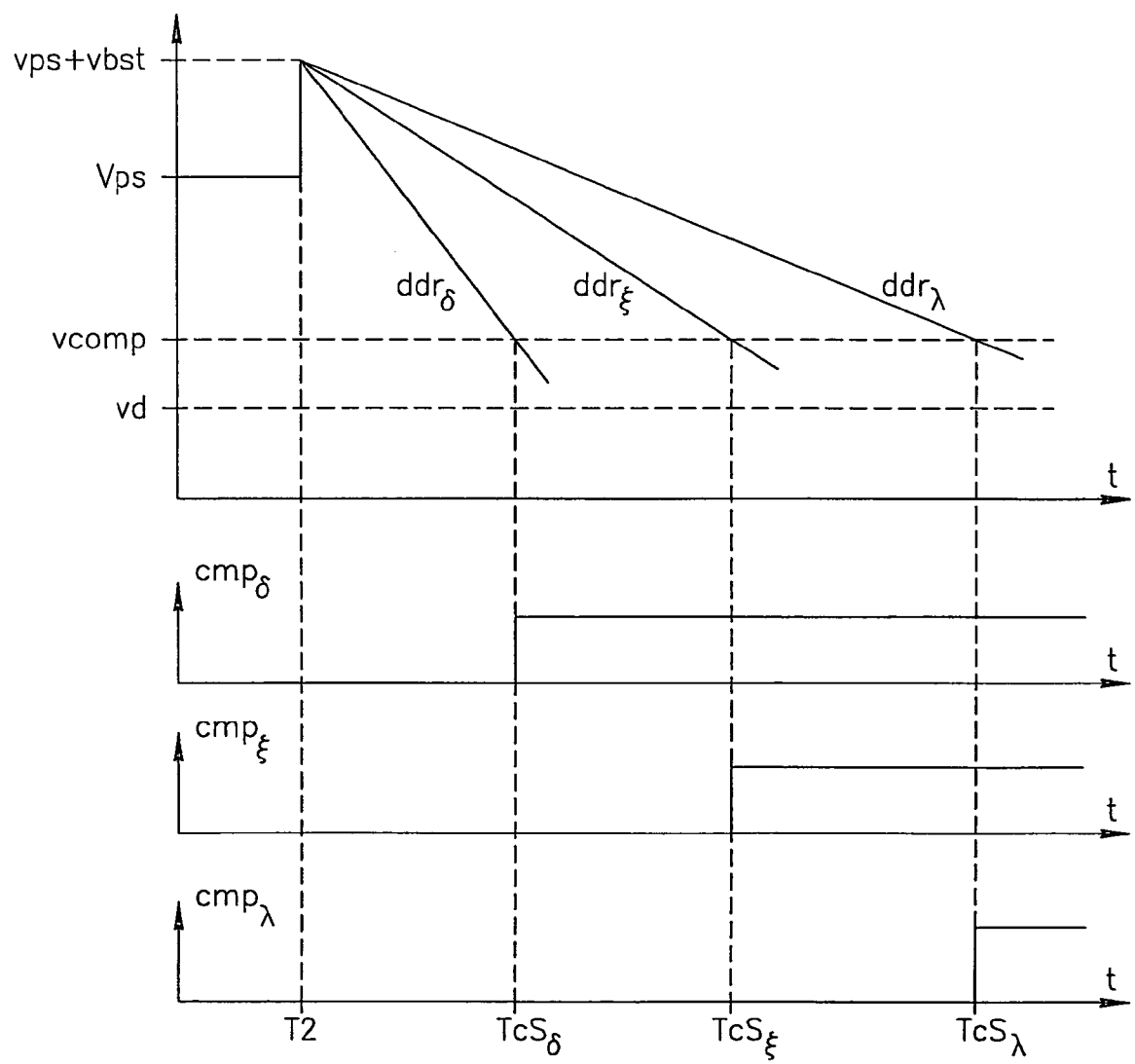
FIG. 6 is a simplified graphical illustration of waveforms of comparator signals of the memory sensing system of FIG. 2, in accordance with an embodiment of the present invention.

FIG. 6 illustrates waveforms of the comparator signals, in accordance with an embodiment of the present invention and the above explanation.

Referring again to FIG. 2, each comparator signal of the comparators 22 may be transmitted to the input of a data unit 24 together with the output signals lat<m:0>of the reference comparators. The data unit 24 may compare the rising time of the comparator signal Trise(cmp) with the rising time Trise(latξ), (ξ=0, . . . ,m) of the output signals lat<m:0> of the reference comparators. Examples of output signals of the data unit 24 are shown in Table 2:

TABLE 2

| | $T_{rise}$ (cmp) > $T_{rise}$ (lat$_c$) | | | | | | | |
|---|---|---|---|---|---|---|---|---|
| ξ | 0 ÷ m | 0 ÷ (m − 1) | 0 ÷ (m − 2) | 0 ÷ (m − 3) | 0 ÷ (m − 4) | 0 ÷ (m − 5) | 0 ÷ (m − 6) | 0 ÷ (m − 7) |
| dt | 000 | 001 | 010 | 011 | 100 | 101 | 110 | 111 |

Figure 7:
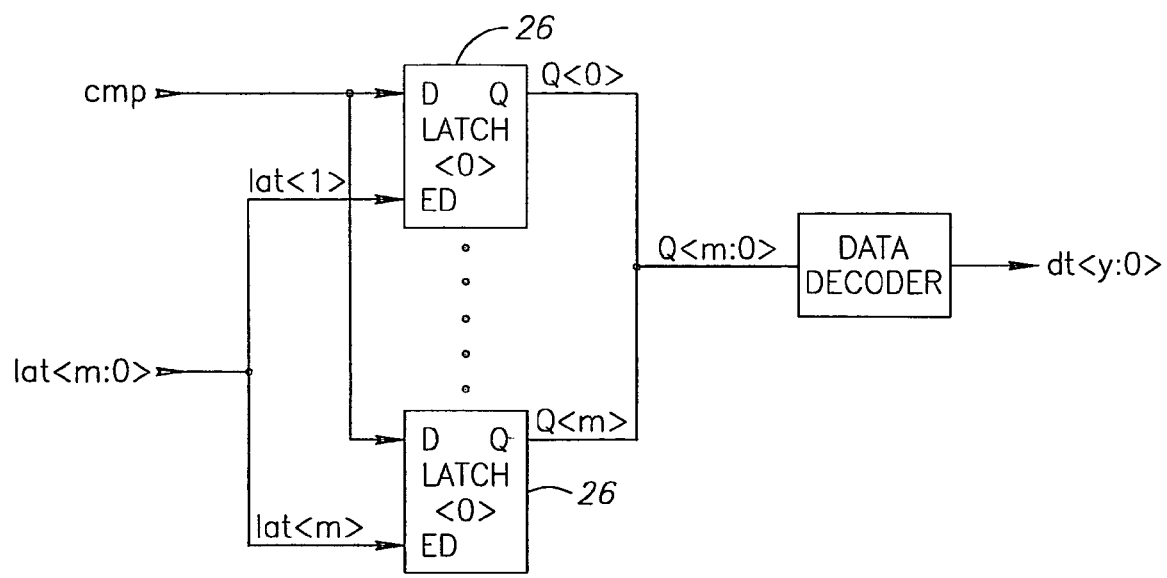
FIG. 7 is a simplified block diagram of a data unit of the memory sensing system, constructed and operative in accordance with an embodiment of the present invention.

Reference is now made to FIG. 7, which illustrates one example of data unit 24, constructed and operative in accordance with an embodiment of the present invention. The signal cmp is provided to the D-input of m digital latches 26. Each digital latch 26 may receive one of the lat signals of the reference comparators at its Eb-input. The digital latches 26 may function according to the follow rule shown in Table 3:

TABLE 3

| Eb | Q |
|---|---|
| 0 | D |
| 1 | Hold |

When the Eb signal is a low level (logical "0"), the digital latch 26 transmits input signal D to output Q. When the Eb signal goes to a high level (logical "1"), the digital latch 26 transmits whatever the previous value was to output Q.

Figure 8:
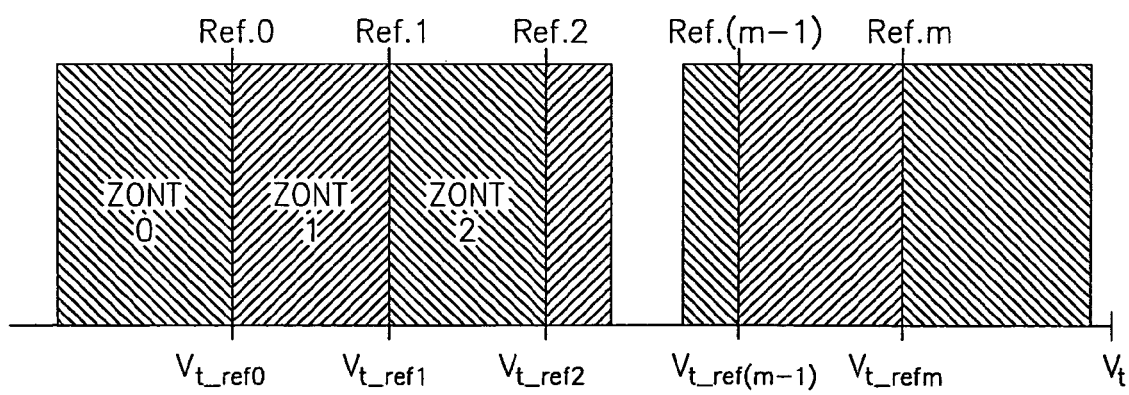
FIG. 8 is a simplified graphical illustration of the distribution of the threshold voltages of reference memory cells of the memory sensing system, in accordance with an embodiment of the present invention.

The reference units 16 (numbered 0 to m) shown in FIG. 2 may comprise reference memory cells (Ref0 to Refm). Reference is now made to FIG. 8, which illustrates a distribution of the threshold voltages (Vtref0 to Vtrefm) of the reference memory cells, in accordance with an embodiment of the present invention. The threshold voltages may be distributed in m+1 zones in intervals along the Vt axis. For example, the threshold voltage Vto of some cell, which corresponds with the channel number α of the sensing (dbl<α>−ddr<α>−cmp<α>), may be in zone τ. This means that the threshold voltage Vto is greater than the threshold voltages in the previous zones (that is, Vtref0 to Vtref(τ−1)), and less than the threshold voltages in the next zones (that is, Vtrefτ to Vtrefm). Accordingly, the current Io of that cell is greater than the current in the next zones (Irefτ to Irefm), and less than the current in the previous zones (Iref0 to Iref(τ−1)). Hence, the signal cmp<α> corresponding to that cell rises earlier than signals lat<τ>÷lat<m>, and later than signals lat<0>÷lat<τ−1>. Accordingly, internal signals Q<m:0> of the data unit number α are given by the following equation:

Q<(τ−1):0>=0, Q<m:τ>=1.

A data decoder may convert signals Q<m:0> to a final data bus dt<y:0> according to the rule (in decimal form):

$dt_{decimal} = Q<0> + Q<1> + Q<2> + \ldots + Q<m-1> + Q<m>$.

A binary form of the data may be obtained by a conventional formula for decimal to binary conversion:

$dt_{decimal} = dq<0>*2^0 + dq<1>*2^1 + dq<2>*2^2 + dq<3>*2^3 + \ldots + dq<y>*2^y$, or in table form in Table 4:

TABLE 4

| Q | 0 | 1 | 11 | 111 | 1111 | 11111 | 111111 | 1111111 |
|---|---|---|---|---|---|---|---|---|
| $dt_{decimal}$ | 0 | 1 | 2 | 3 | 4 | 5 | 6 | 7 |
| $dt_{binary}$ | 0 | 1 | 10 | 11 | 100 | 101 | 110 | 111 |

The relation between the reference channel number (m) and the bit number of the signal dt (y) may be expressed as follows:

$m = 2^y - 1$, or in table form in Table 5:

TABLE 5

| m | 1 | 3 | 7 | 15 | 31 |
|---|---|---|---|---|---|
| y | 1 | 2 | 3 | 4 | 5 |

An operation voltage Vps of the memory sensing system may equal:

$$V_{ps\_min} = V_{M1ds} + V_{cd} + V_{MCds} + V_{cd}, \quad (7)$$

where $V_{M1ds}$ is the drain/source voltage of the transistor M1 in the drain driver;

$V_{cd}$ is the column decoder voltage drop; and $V_{MCds}$ is the drain/source voltage of the memory cell.

As mentioned previously in the background of the invention, the minimum supply voltage VDD_MIN of the prior art is equal to 2.9 V, and the prior art memory device 100 cannot be used in applications that use a VDD supply voltage lower than 2.9 V. However, in the present invention, the minimum supply voltage Vps_min is less than the prior art VDD_MIN (see equation (1) above in the background of the invention) by VDIODE_MAX, and approaches the minimal voltage VBL_MIN. VDIODE_MAX may be approximately equal to one volt, for example. This means that the present invention may be used in applications that use a VDD supply voltage lower than 2.9 V, down to 1.9 V, an improvement of over 34%.

Thus, the present invention may transform a signal (e.g., current) from the memory cell to a time delay (e.g., a digital signal delay) and compare the time delay to a time delay of a reference cell (e.g., the rise or fall times of the signals). The drain driver operates at a low (close to minimal) voltage to generate the analog signal Vddr. The signal Vddr is preferably linearly dependent upon the memory cell current. The memory cell current is preferably integrated on the local capacitor.

The present invention may be used as a multi-level sensing system for a multiplicity of reference units. In addition, the invention may also be used for a single reference unit.

It is noted that in the prior art, signals from the memory cells are coupled in a one-to-one correspondence to the sense amplifiers. There is the same number of signals as there are sense amplifiers. However, the reference memory cells are coupled in parallel to all of the sense amplifiers. This results in a significant mismatch between two sense amplifier input signals, because one of them (from the array) is connected to a single sense amplifier whereas the other (from the reference) is connected to all of the sense amplifiers. The mismatch may lead to errors in read data. In contrast, in the present invention, all the analog signals from the array cells and the reference cells are matched, as described hereinabove.

Figure 5:
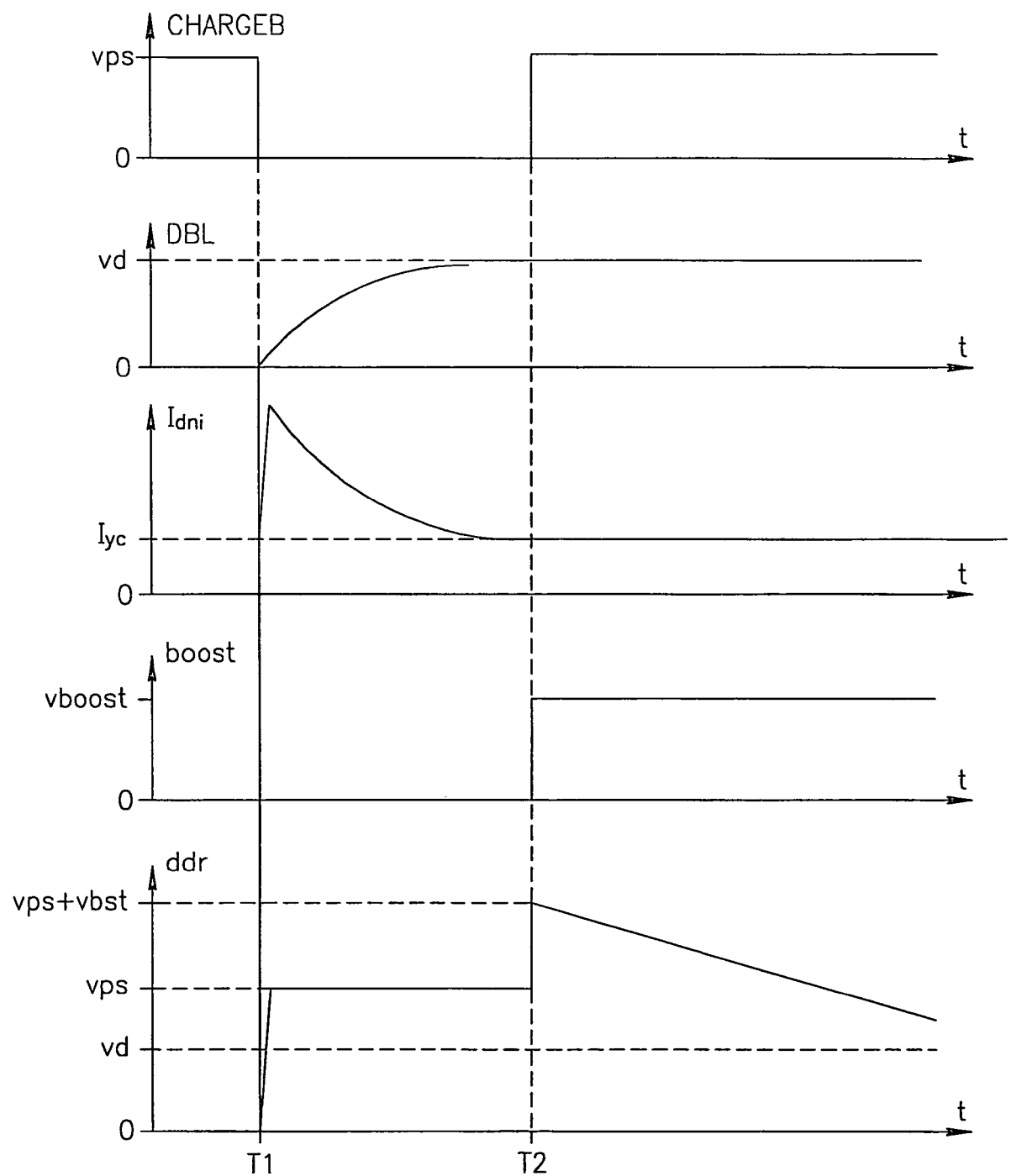
FIG. 5 is a simplified graphical illustration of waveforms of the drain driver signals, in accordance with an embodiment of the present invention.
Figure 9:
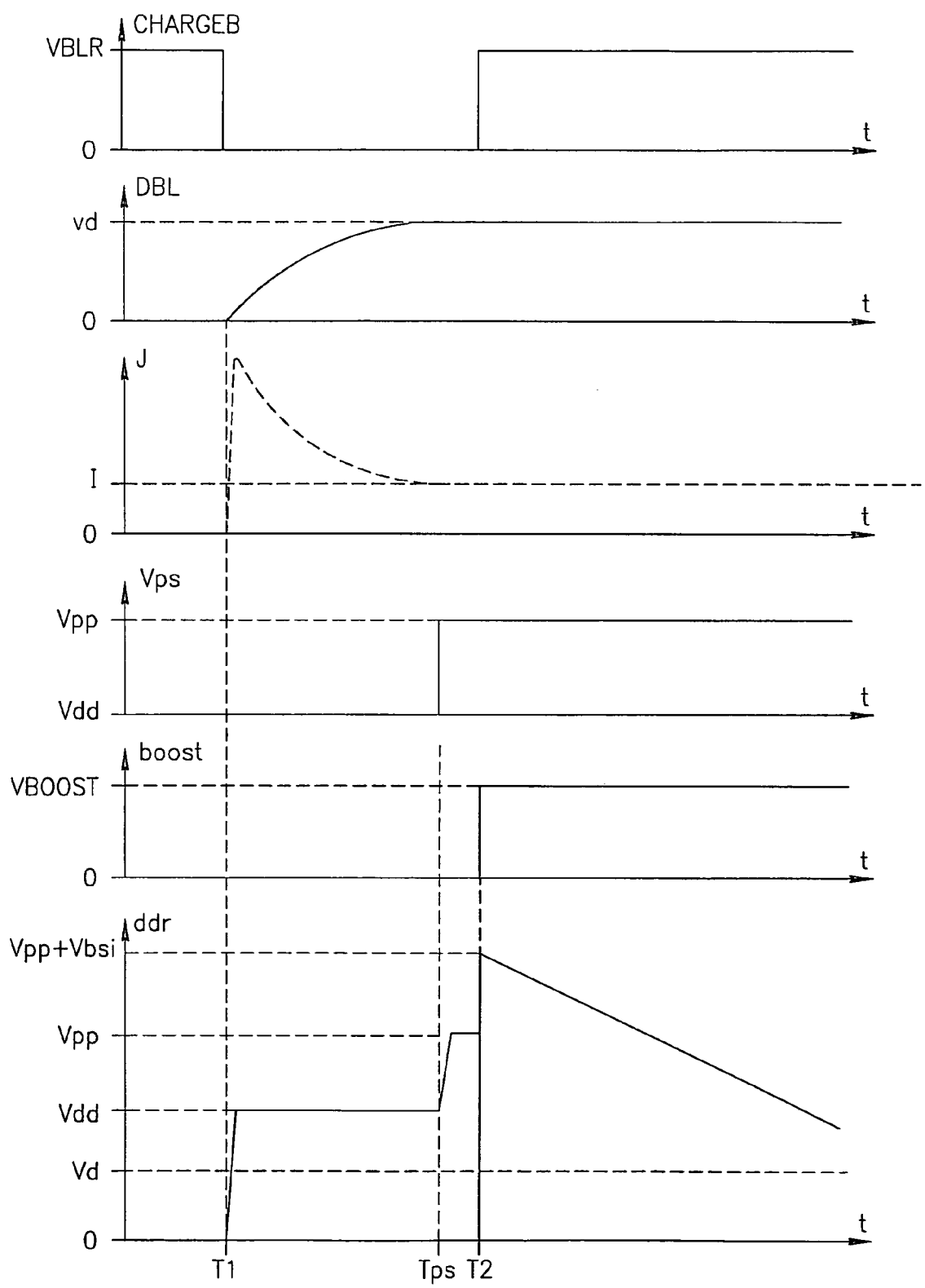
FIG. 9 is a simplified graphical illustration of waveforms of the drain driver signals, in accordance with another embodiment of the present invention, different from that of FIG. 5.

Reference is now made to FIG. 9, which illustrates waveforms of the drain driver signals, in accordance with another embodiment of the present invention, different from that of FIG. 5. In this embodiment, node Vps is connected to the system voltage supply Vdd until a time Tps, when power dissipation is maximal for charging the read path parasitic capacitors. At time Tps, the current through node Vps is significantly lower (e.g., practical equal to IMC), and node Vps is switched to a higher voltage supply than Vdd. This embodiment may be useful to increase the possible range of boosting Vddr.

Figure 10:
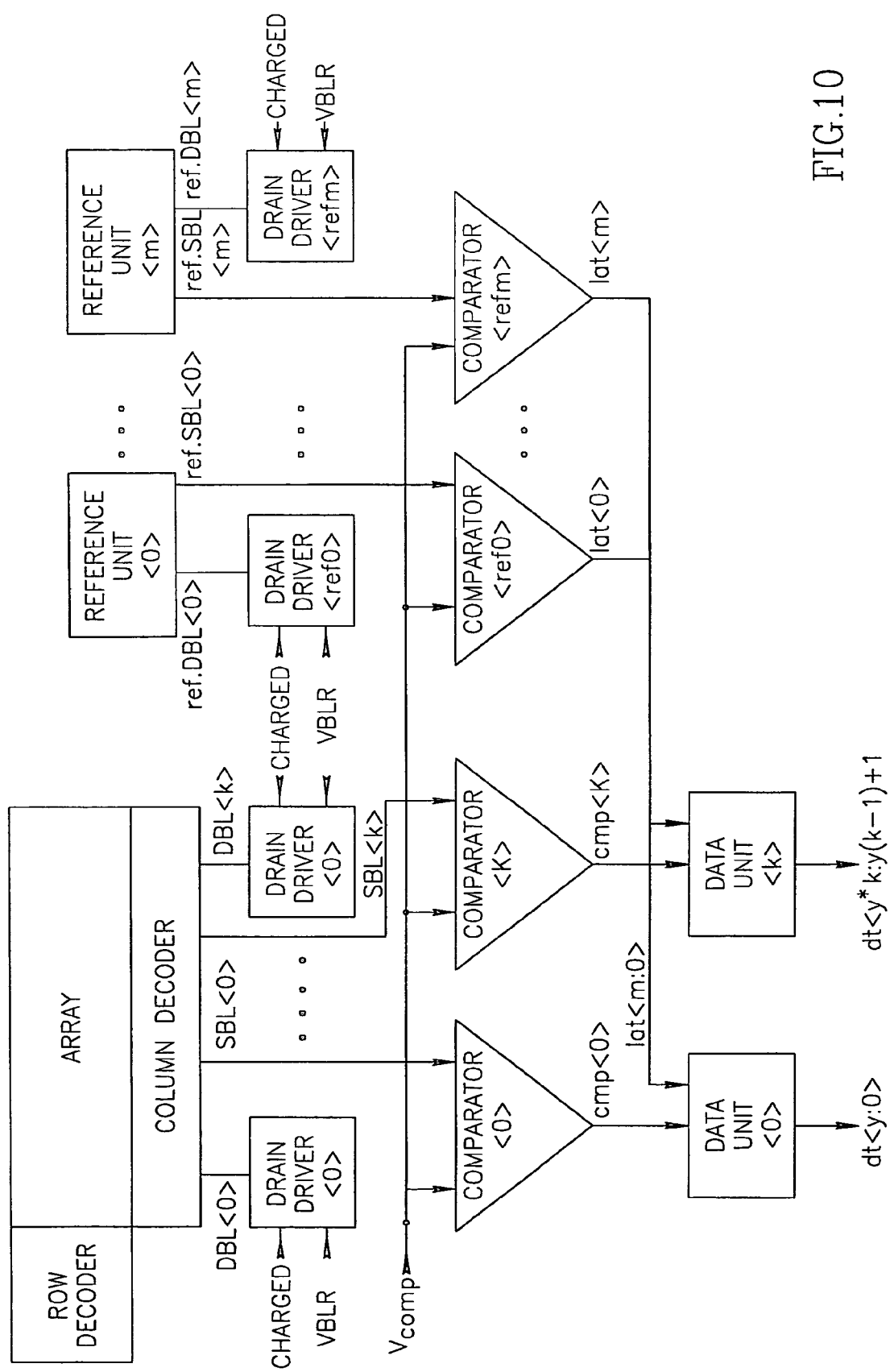
FIG. 10 is a simplified block diagram of a memory sensing system, in accordance with another embodiment of the present invention.
Figure 11:
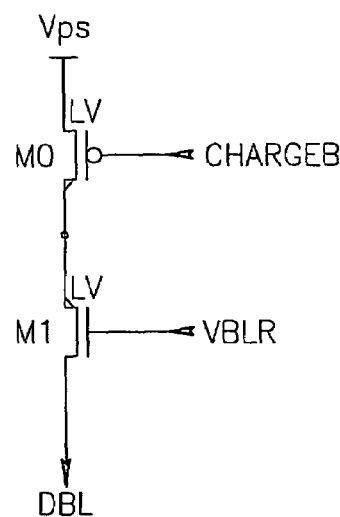
FIG. 11 is a simplified block diagram of the drain driver for the embodiment of FIG. 10, constructed and operative in accordance with an embodiment of the present invention.
Figure 12:
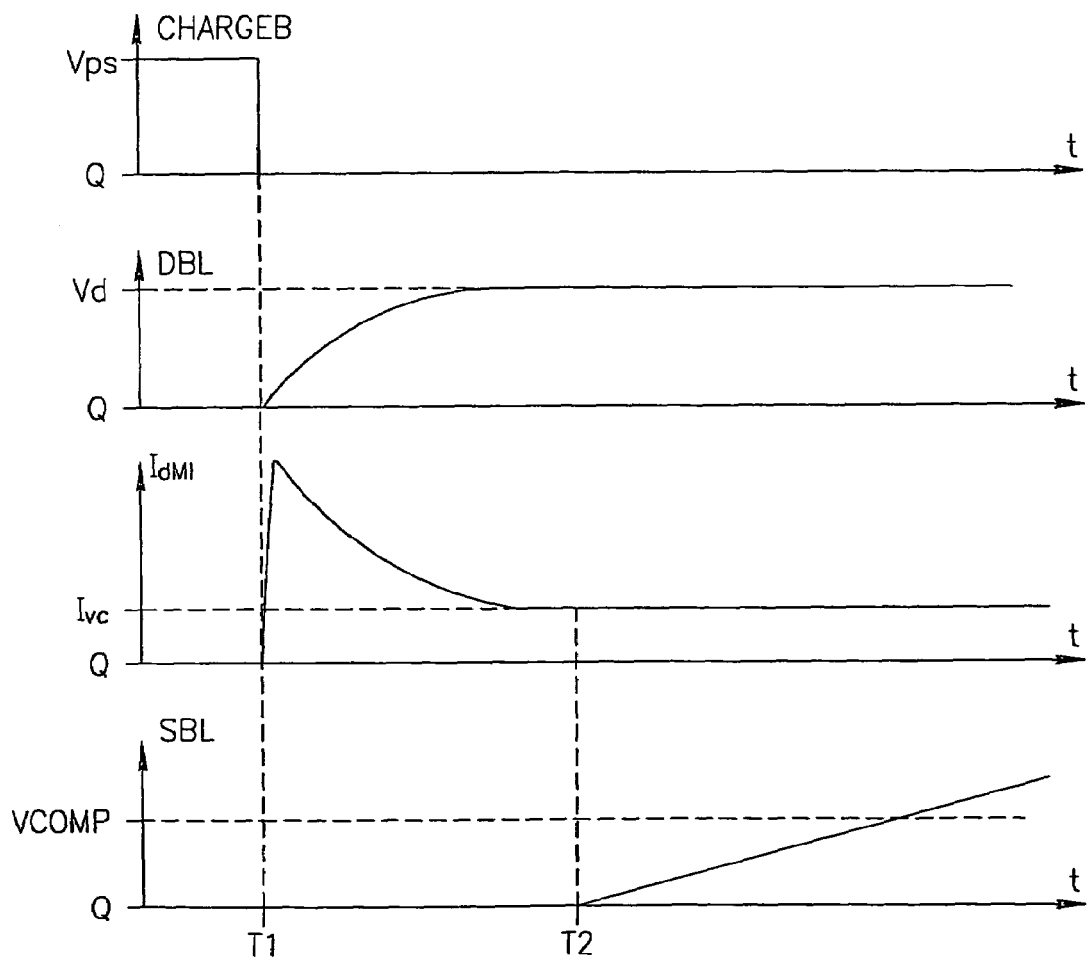
FIG. 12 is a simplified graphical illustration of the waveforms of the drain driver signals, for the embodiment of FIG. 10.

Reference is now made to FIG. 10, which illustrates a memory sensing system, in accordance with another embodiment of the present invention, and to FIG. 11, which illustrates the drain driver for the embodiment of FIG. 10. In this embodiment, the nodes SBL<k:0> may be connected to the comparator inputs instead of the ddr<k:0> signals, as shown in FIG. 10. The drain driver circuit is a simplified version of the drain driver circuit of FIG. 4. FIG. 12 illustrates the waveforms of the drain driver signals, in accordance with this embodiment of the invention. The development of the signals SBL<k:0> may be as described in U.S. Pat. No. 6,128,226 to Eitan and Dadashev, assigned to the common assignee of the present application.

It will be appreciated by persons skilled in the art that the present invention is not limited by what has been particularly shown and described hereinabove. Rather the scope of the present invention includes both combinations and subcombinations of the features described hereinabove as well as modifications and variations thereof which would occur to a person of skill in the art upon reading the foregoing description and which are not in the prior art.

What is claimed is:

1. A method for sensing a signal received from an array cell within a memory array, the method comprising the steps of:
   generating an analog voltage Vddr proportional to a current of a selected array cell of said memory array; and
   upon receiving a timing signal based on a comparison of an output of a reference cell, comparing said analog voltage Vddr with a reference constant voltage Vcomp to generate an output signal.

2. The method according to claim 1, further comprising providing a reference unit with a reference cell having a similar structure and a similar current path therethrough to that of said array cell, and providing a drain driver for driving drain bit lines of said memory array and reference drain bit lines of said reference unit, wherein said drain driver generates the analog voltage Vddr.

3. The method according to claim 1, wherein if said analog voltage Vddr is greater than the reference analog voltage Vcomp then a low output digital signal is output, and if said analog voltage Vddr is not greater than the reference analog voltage Vcomp then a high output digital signal is output.

4. The method according to claim 1, further comprising:
   discharging said memory array and said reference unit;
   charging said memory array and said reference unit so as to generate an array cell signal and a reference signal, respectively, and a timing signal;
   generating a read signal when said timing signal reaches a predefined voltage level; and
   generating a sensing signal from the difference of said cell and reference signals once said read signal is generated.

5. A method for sensing a memory cell, the method comprising the steps of:
   transforming a signal from a memory cell to a time delay based on a comparison with a constant voltage; and
   sensing said memory cell by comparing said time delay to a time delay of a reference cell.

6. The method according to claim 5, wherein said time delay comprises a digital signal delay.

7. The method according to claim 5, wherein comparing said time delay to the delay of the reference cell comprises comparing at least one of rise and fall times of said time delays.

8. The method according to claim 5, wherein transforming the signal from the memory cell to the time delay comprises generating an analog voltage Vddr proportional to a current of said memory cell.

9. The method according to claim 8, wherein comparing said time delay to the time delay of the reference cell comprises comparing said analog voltage Vddr with a reference analog voltage Vcomp to generate an output digital signal.

10. Apparatus for sensing a signal received from an array cell within a memory array, the apparatus comprising:
    a drain driver adapted to generate an analog voltage Vddr proportional to a current of a selected array cell of said memory array; and
    a comparator adapted to compare said analog voltage Vddr with a constant reference Vcomp to generate an output signal upon receiving a timing signal based on a comparison of an output of a reference cell.

11. The apparatus according to claim 10, further comprising a reference unit with a reference cell having a similar structure and a similar current path therethrough to that of said array cell, wherein said drain driver is adapted to drive drain bit lines of said memory array and reference drain bit lines of said reference unit.

12. The apparatus according to claim 10, wherein said comparator compares said analog voltage Vddr with a reference analog voltage Vcomp and generates said output digital signal in the following manner:
    if said analog voltage Vddr is greater than the reference analog voltage Vcomp then a low output digital signal is output, and if said analog voltage Vddr is not greater than the reference analog voltage Vcomp then a high output digital signal is output.

13. The apparatus according to claim 10, further comprising a data unit that receives said output digital signal.

14. Apparatus for sensing a memory cell comprising:
    a driver adapted to transform a signal from a memory cell to a time delay based on a comparison with a constant voltage; and
    a comparator adapted to compare said time delay to a time delay of a reference cell.

15. The apparatus according to claim 14, wherein said time delay comprises a digital signal delay.

16. The apparatus according to claim 14, wherein said comparator compares at least one of rise and fall times of said time delays.

17. The apparatus according to claim 14, wherein said comparator compares said analog voltage Vddr with a reference analog voltage Vcomp and generates said output digital signal in the following manner:

if said analog voltage Vddr is greater than the reference analog voltage Vcomp then a low output digital signal is output, and if said analog voltage Vddr is not greater than the reference analog voltage Vcomp then a high output digital signal is output.

\* \* \* \* \*